(12) United States Patent
Scholte Van Mast et al.

(10) Patent No.: US 7,706,908 B2
(45) Date of Patent: Apr. 27, 2010

(54) METHOD FOR POSITIONING A WAFER

(75) Inventors: Bart Scholte Van Mast, Azmoos (CH); Holger Christ, Trübbach (CH); Ruedi Schmucki, Buchs (CH)

(73) Assignee: OC Oerlikon Balzers AG, Balzers (LI)

( * ) Notice: Subject to any disclaimer, the term of this patent is extended or adjusted under 35 U.S.C. 154(b) by 478 days.

(21) Appl. No.: 11/815,741

(22) PCT Filed: Jan. 9, 2006

(86) PCT No.: PCT/CH2006/000015

§ 371 (c)(1),
(2), (4) Date: Aug. 7, 2007

(87) PCT Pub. No.: WO2006/089435

PCT Pub. Date: Aug. 31, 2006

(65) Prior Publication Data

US 2008/0152474 A1 Jun. 26, 2008

(30) Foreign Application Priority Data

Feb. 22, 2005 (CH) .................................. 309/05

(51) Int. Cl.
*G06F 19/00* (2006.01)
*H01L 21/677* (2006.01)
(52) U.S. Cl. ................. 700/114; 700/112; 700/176; 700/178; 700/192; 700/195; 414/217
(58) Field of Classification Search ............... 700/112, 700/114, 176, 178, 192, 195, 228, 254; 414/217
See application file for complete search history.

(56) References Cited

U.S. PATENT DOCUMENTS

| 5,126,028 | A | * | 6/1992 | Hurwitt et al. | .......... | 204/192.13 |
| 5,586,585 | A | * | 12/1996 | Bonora et al. | .................. | 141/93 |
| 5,855,681 | A | * | 1/1999 | Maydan et al. | ............. | 118/719 |
| 6,082,950 | A | * | 7/2000 | Altwood et al. | ............. | 414/217 |

(Continued)

*Primary Examiner*—Ramesh B Patel
(74) *Attorney, Agent, or Firm*—Notaro & Michalos P.C.

(57) ABSTRACT

The invention relates to a method for positioning a wafer (3) with a reference mark (6) in a vacuum processing unit with a transport chamber containing a transport device (2, 20, 21) for moving the wafers (3) in a plane to a process chamber arranged on said chamber and a single sensor (1), arranged within the transport chamber before the process chamber for recording the position of the wafer (3) by means of recording the edge thereof at a first detection point (4) and a second detection point (5), such that the actual position of the wafer (12) with a known wafer diameter can be determined with electronic analysis of both measured detection points (4, 5) and the transport device (2, 20, 21) guides the wafer (3) to a desired set position. The wafer (3) is aligned in a given position on the transport device (2, 20, 21) in relation to the reference marks (6) thereof and the projection of the reference marks (6) determines a non-permitted zone (22) along a direction of movement on the wafer (3) and hence defines a free zone on the remainder of the wafer (3). The sensor (1) is arranged in the transport chamber such as to guarantee that the non-permitted zone (22) is not scanned and the sensor (1) can thus only record the circular art of the wafer edge and not parts of the reference mark (6).

19 Claims, 3 Drawing Sheets

U.S. PATENT DOCUMENTS

| | | | |
|---|---|---|---|
| 6,537,012 B2 * | 3/2003 | Kawahara et al. | 414/217 |
| 6,577,382 B2 * | 6/2003 | Kida et al. | 355/77 |
| 6,690,986 B1 * | 2/2004 | Mitchell et al. | 700/112 |
| 6,760,976 B1 * | 7/2004 | Martinson et al. | 33/520 |
| 7,319,920 B2 * | 1/2008 | Donoso et al. | 700/254 |
| 7,415,774 B2 * | 8/2008 | Lindberg | 33/520 |
| 7,457,680 B2 * | 11/2008 | Akiyama et al. | 700/112 |
| 2007/0031236 A1 * | 2/2007 | Chen | 414/936 |

* cited by examiner

METHOD FOR POSITIONING A WAFER

FIELD AND BACKGROUND OF THE INVENTION

The invention relates to a method for positioning a wafer with a reference marker in a vacuum process installation according to claim 1.

In modern vacuum process facilities circular flat substrates or workpieces, which are also referred to as wafers, are surface-treated, such as for example coated, etched, cleaned, thermally treated etc., in such fully automated vacuum process systems. In order to automate such processes and to be able to carry out multi-stage processes in different facility areas, automated transport systems, a type of handling robot, are employed. In particular the treatment of semiconductor wafers in such processes requires very high quality of treatment, such as in particular high cleanliness, high precision and careful treatment of the substrates. Due to the stated high requirements, such facilities preferably include a lock chamber, where the wafers are moved from the atmospheric environment into a vacuum chamber and subsequently into a process station or, as a rule, sequentially into several process stations in order to be able to carry out the required surface treatment. With the aid of a transport device the wafers are delivered from the lock chamber into the process chamber in a horizontal transport plane, and after the wafer has been deposited in the process chamber, the latter is, as a rule, closed in order to be able to carry out the process under the required vacuum and process conditions. If several process steps are necessary, the wafer is again transported out of the one process chamber in the same manner and, for the next process step, is transported into another process chamber.

Especially preferred types of facilities are so-called cluster systems. In such systems, the lock chamber and the process chamber, or the several chambers, are arranged peripherally about the substantially central transport chamber. In the case of more than one lock chamber and in particular in the case of several process chambers, these chambers are arranged in a type of star-shaped configuration about the centrally located transport chambers. The transport device in this case is located in this centrally located transport chamber and has access, on the one hand, to the at least one lock chamber and, on the other hand, to the process chamber. Between the transport chamber and the remaining chambers conventionally and preferably a so-called lock valve is disposed in order to be able to partition the chambers against one another during the locking process or during the process step. During the transport process of a wafer, the transport device subsequently extends appropriately through the open lock gates in order to deposit the wafer at the designated location.

The transport device moves the wafer translatively in one plane and consequently in two directions of motion. In said preferred cluster systems with the transport device disposed in the central transport chamber, the device is conventionally formed as a mechanism which pivots about a center of rotation and forms therewith the one rotating direction of motion and which can execute a further second translatory motion radially with respect to the center of rotation back and forth away from/to this center of rotation. On this transport device, for example a length-adjustable arm mechanics rotatable in the horizontal plane, the wafer to be transported is subsequently deposited in the end region of this arm. Such a configuration can in this case readily also transport a wafer over relatively great path distances, for example of the orders of magnitude of 1 m or more, from a lock chamber into the transport chamber and from here, in turn, into and out of the process chamber and extend through the corresponding opened lock doors. At the beginning of the transport cycle the wafer is deposited under atmospheric pressure onto the transport mechanism as precisely as possible and always in the same position in order to be able to transport it subsequently also precisely to a predetermined position. However, the deposition of the wafer on the transport mechanism, as well as also the transport mechanism itself, is afflicted with imprecisions or with tolerance errors. Further imprecisions or shifts of the wafer position on the transport mechanism can also occur in the process station due to effects in the process chamber. For this reason the precise position of the wafer must be acquired or measured in order to check the correct wafer position and/or to be able to carry out corrections for the positioning. For this purpose several sensors are conventionally utilized. These sensors are disposed in known manner directly in the proximity of the end position, thus in the processing chamber, where the process is to take place precisely, and subsequently end-positioned in the nominal position. The use of several sensors and the high electronic expenditure together with the positioning process with the transport device leads to very high expenditures and, moreover, therewith, the higher the necessary expenditures, the system trustworthiness or the operational reliability of the vacuum process installation decreases. This can lead to operational failures and stop-downs, to increased maintenance expenditure and also to increased rejects in the production of expensive semiconductor wafers.

Therefore solutions have repeatedly been sought for realizing simpler transport systems with simplified positioning methods in order to decrease expenditures and increase reliability. U.S. Pat. No. 6,760,976 B1 discloses a method for centering a semiconductor wafer, in which a single sensor is utilized instead of several positioning sensors. The method builds on the fact that a circular wafer is utilized, the diameter of which is known and by moving the wafer edge to the sensor at least two points are acquired and with these measuring results, together with the known wafer diameter, the actual position center of the water can be determined. On the basis of this determined center position of the wafer a correction can subsequently be carried out and the wafer can be moved with the transport device into the desired nominal position for the subsequent process step. This method can be applied with circular wafer substrates in which the periphery has a circular closed line and is not perturbed. Semiconductor wafers such as are used today, require a so-called reference marker on the circle periphery, for example a so-called flat, which serves for the circular position detection for the alignment of the structural elements on the wafer and of the wafer itself. As soon as a wafer of this type must be worked, said method leads to errors or failure if edge regions are acquired by the sensor which deviate from the circular shape. For wafers with reference marker this method is therefore not usable.

SUMMARY OF THE INVENTION

The present invention addresses the problem of eliminating said disadvantages of prior art. The problem addressed is in particular of being able to carry out a method for positioning a wafer with a reference marker in a vacuum process installation, which operates with high reliability and high precision and permits an economical realization.

According to the invention the problem is solved through a method according to claim 1 for positioning a circular wafer comprising a reference marker on the wafer periphery. The dependent claims define further advantageous embodiments.

The various features of novelty which characterize the invention are pointed out with particularity in the claims annexed to and forming a part of this disclosure and are entirely based on the Swiss priority application no. 309/05, filed Feb. 22, 2005.

BRIEF DESCRIPTION OF THE DRAWINGS

In the following the invention will be explained in further detail by example and with schematic Figures. In the drawing depict.

Circular or disk-shaped flat substrates, such as in particular semiconductor wafers 3, for example silicon wafers, conventionally have a so-called reference marker 6, often also referred to as flat, with which the disk-shaped wafer 3 can be acquired for circular positioning or with respect to its rotational position relative to the center of the circular wafer periphery. Such a flat is conventionally formed as a small segment-like section on the wafer periphery, such that the major portion of the wafer edge remains as a circular periphery. The rotational position of this largely circular disk can consequently be detected through this flat and can be aligned. A reference marker 6 can, for example, also be implemented as a notch on the wafer edge.

Figure 1A:
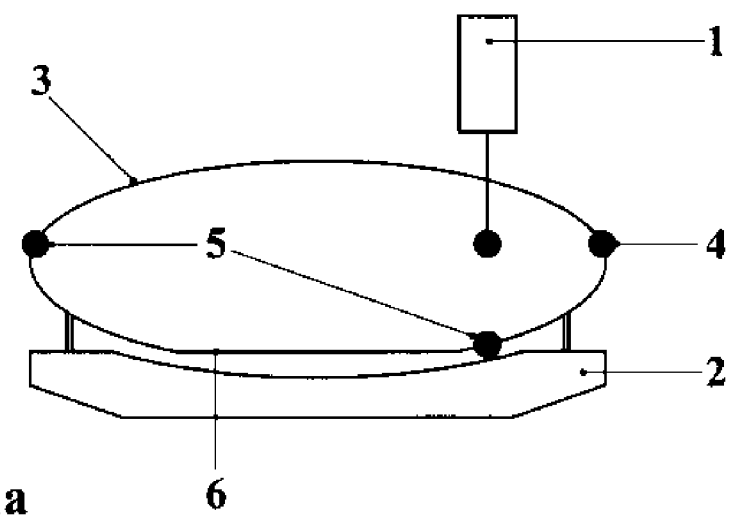
FIG. 1a a wafer deposited on the mounting of a transport device in oblique three-dimensional view in the direction onto the reference marker of the water and in the direction of the one direction of motion, FIG. 1b the configuration according to FIG. 1a in top view, FIG. 2a a wafer with reference marker and depiction of the associated wafer zone projecting in the one, radial transport direction and with the resulting free zones, FIG. 2b a wafer corresponding to FIG. 2a with the zones resulting when using the transport device for wafers of different size, such as here for two differing wafer diameters, FIG. 3a measurement values from several actual wafer positions and their discrepancies from the nominal position when error setting the transport system in polar depiction, FIG. 3b depiction of the measurement values corresponding to FIG. 3a as a function of time, FIG. 4a measurement values of several wafers with depiction of the discrepancy from the nominal position when sliding the wafer on the transport device due to sticking and adhering on shielding devices in polar depiction, FIG. 4b depiction of the measurement values corresponding to FIG. 4a over time, FIG. 5a measurement values of several wafers with depiction of the shift from the nominal position upon shifting errors through electrostatic mounting in polar depiction, FIG. 5b depiction of the measurement values corresponding to FIG. 5a over time.
Figure 1B:
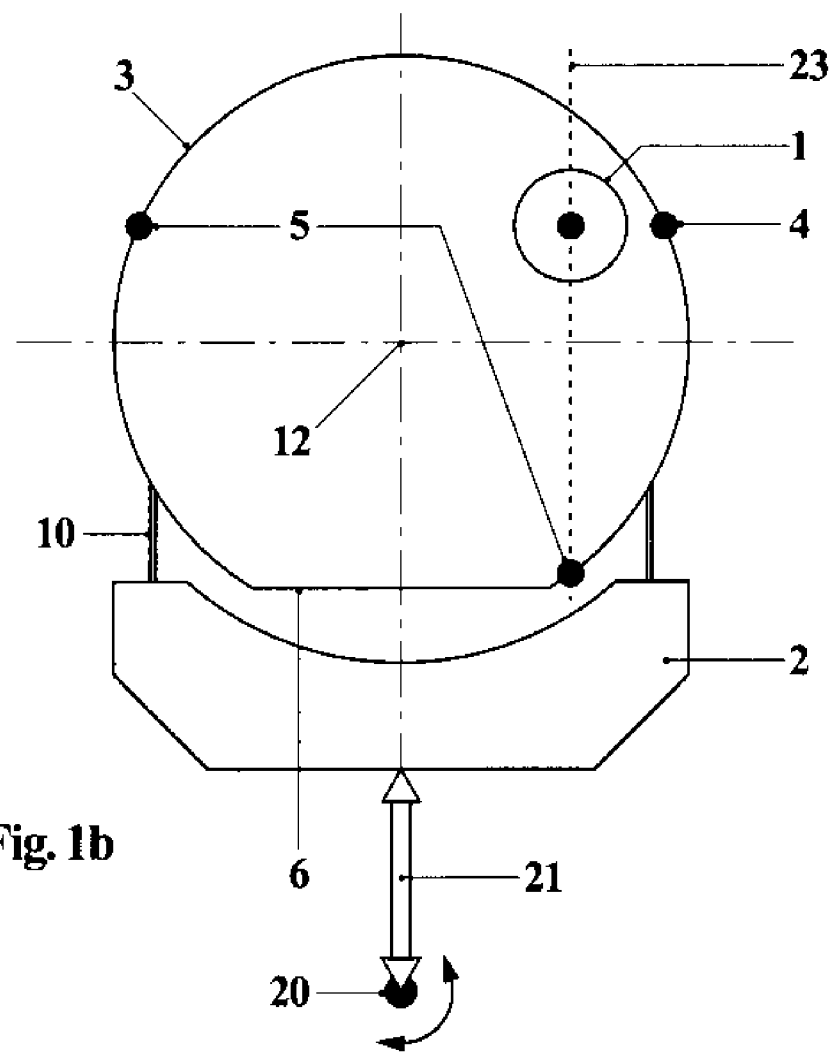

Such semiconductor wafers 3 are as a rule a few tenths mm thick and have diameters in the range of a few cm to a few tenths cm, such as for example, typically customarily in the range of approximately 10 to 30 cm diameter. Of the working of such wafers 3 in vacuum process installations very high requirements are made. Such wafers 3 must in particular be highly precisely positioned in the area of the process stations for the working. The positioning with potential discrepancies from the nominal position must also be continuously acquired in order to be able to avoid processing errors resulting in rejects. In vacuum process installations for working semiconductor wafer surfaces, as a rule, several process steps are carried out sequentially with this process being highly automated. Due to the sensitivity of such wafers 3, they are conventionally transported in a horizontal plane, wherein the plane of the wafer disk, as a rule, is substantially parallel to the plane of transport or coincides with it. Using this manner of transporting, wafer 3 is placed onto a transport device 2, 20, 21 and consequently rests only with its own weight on a wafer mounting 10. Hereby only areas of the backside of the wafer are in contact with the mounting and contacting of the sensitive front side to be worked is avoided. The securing proper of the wafer, for example on its periphery, can therewith be avoided and the sensitive wafer surface can thereby be protected especially in the sensitive edge region also. In such vacuum process installations wafers 3 are transported into the vacuum region via a lock chamber and subsequently transported from this lock chamber into the corresponding transport chambers with the aid of a transport device 2, 20, 21 into the processing chamber where they are worked with appropriate vacuum processes, such as for example coating and/or etching processes. To be able to carry out a further process step, such as for example a second coating, without having to move the wafer out of the installation, the wafer 3 is guided with the transport device into the next process chamber, deposited there and subsequently worked. Depending on the requirement and implementation of the vacuum process installation, in this manner several process steps can automatically be carried out in succession. Especially preferred vacuum process installations are so-called cluster systems. Such installations have a substantially centrally located transport vacuum chamber, in which a transport device 2, 20, 21 is disposed for receiving and moving a wafer 3 in a transport plane, wherein at this transport chamber at least two process chambers or several chambers are disposed and the wafers are successively transported into such process chamber to be worked. At the substantially centrally located transport chamber at least one further chamber is disposed which forms a vacuum lock. The lock chamber and the process chamber is provided with elements in order to partition the various vacuum atmospheres against one another, such as for example provided with locks, which permit introducing the wafer 3 with the aid of the transport device into the appropriate chambers. The transport device extends through this region and retracts again from this region after the wafer has been deposited to be worked and/or to be transported into the system. In such installations a transport device is so disposed in the central transport chamber of the vacuum process installation that it has access to the various peripherally located chambers. The transport device 2, 20, 21 is here preferably implemented as a transport arm 21, which is disposed such that it can rotate in the transport chamber with respect to its vertical axis about a center of rotation 20 and can be moved back and forth from this center 20 in the radial direction, as is indicated in FIG. 1b with the direction arrows at the transport arm 21. The transport device 2 with the transport arm 21 disposed thereon, which permits the radial deflection can be implemented variously, such as for example as tong-like extension system or as bellows-like linearly radially movable system. For the rotational movement about the center of rotation 20 and the radial movement of the transport device 2, 20, 21 controlled drives are utilized in known manner such as for example electronically controlled electromotor drives, which permit precise control and positioning.

To be transported the wafer 3 is placed on the end region of the arm-form transport device on that side of the arm facing away from the center of rotation 20 on a wafer mounting 10 disposed thereon in a predetermined defined position with respect to the mounting 10. The wafers 3 to be put down must always be deposited in the same position on the wafer mounting 10. The wafers are in this respect aligned with their reference marker 6 on the mounting 10 and always deposited in the same way. Consequently the position of the wafer center 12 is also defined, since the wafer 3 is circular and has a known wafer diameter. Aside from the wafer center 12, which represents the nominal position of wafer 3, the wafer edge or the wafer periphery is also determined. Certain imprecisions can already occur when depositing the wafer 3 onto the mounting 10. In addition, the transport device 2, 20, 21 also entails certain tolerances. Further problems are encountered if the wafer, for example in the process chamber, is slightly shifted with respect to the original nominal position 12 through certain effects when being deposited and picked up again. In order to be able to detect such errors or discrepancies from the nominal position of the wafer center 12 and to be able to carry out the appropriate corrective measures, the actual instantaneous position of the wafer must be acquired and checked and compared with the nominal position, respectively. For this purpose serves a single sensor 1, which detects position points on the wafer edge, such as is schematically shown in FIG. 1. For this purpose, for example, an optical sensor 1 can be utilized, which is disposed beneath, or preferably above, the wafer and during the swivelling of the wafer in the transport plane acquires free of contact the appearance of the edge of wafer 3. To acquire the actual position of the wafer center 12, two detection points 4, 5 on the wafer edge are acquired. By moving the wafer 3 underneath the sensor 1 in the one direction of motion, for example rotating it about the center of rotation 20, a first detection point 4 or 5, respectively, is determined and, by moving the wafer 3 in the radial direction toward or away from the center of rotation 20 along the detection line 23, a second detection point 5 is determined. Since the wafer 3 is circular and the diameter of the wafer 3 is known, consequently, using the position acquisition of the transport device 2, 20, 21 in combination with the detection signal of the sensor 1, the true position of the wafer 3 or of the wafer center 12 can be determined. According to the invention, it must be observed that the wafer edge to be detected is exclusively limited to the circular area of the wafer 3. The edge region of the reference marker 6 must be avoided for this measuring process. In addition care must be taken that the wafer mounting 10 does not disturb the region to be measured if the sensor is disposed on the side of the mounting. The reference marker 6 of a wafer 3 is conventionally formed as a segment-like section of the wafer disk, however, it can also be implemented in the form of a notch.

Figure 2A:
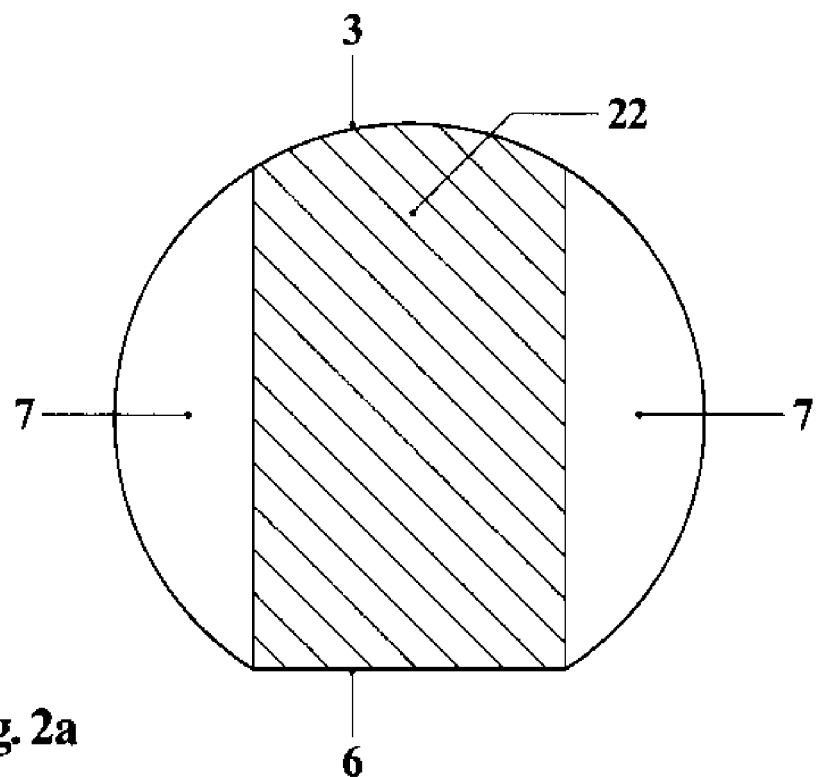

The reference marker 6 is preferably disposed symmetrically with respect to the axis of the one motion direction, whereby the width of the reference marker defines, projected in the motion direction onto the surface of wafer 3 defines a disallowed zone 22 shown in hatched lines in FIG. 2a. The reference marker 6 can per se also be disposed asymmetrically with respect to one motion direction on the mounting 10 of the transport device, however, this would lead to complicated regions, which form the disallowable hatched zone 22, since in this case the projections of two superimposed motion direction would have to be considered. In the preferred transport device with center of rotation 20 and with transport arm 2, 21 radially rotating about it, the wafer 3 with its reference marker 6 is preferably deposited so on the mounting that the reference marker 6 is directed toward the center of rotation 20 and further preferred symmetrically to the axis of the radial transport direction of transport arm 21, as is shown schematically in FIG. 1b.

Corresponding to the example depicted in FIG. 1b, zones 7, 22 on the wafer surface, as depicted in FIG. 2a, result, which are determined by the reference marker 6 of wafer 3 and the one radial motion direction through the projection of reference marker 6 which represents a disallowable hatched zone 22 extending to the opposing peripheral edge of wafer 3. The two segment-like free zones 7 resulting therefrom laterally to the disallowable zone 22, consequently, have exclusively edge regions located on a circular line. The transport device 2, 20, 21 with the wafer 3 deposited thereon is positioned and guided according to the invention with respect to the sensor 1 disposed at a predetermined position such that, when acquiring the wafer edge, exclusively the two detection points 4, 5 on the wafer periphery of the so-called free zones 7 are detected and evaluated for the position acquisition. The tolerance bands of the imprecision of the transport device itself and imprecision of the wafer deposition on the mounting 10 are advantageously additionally taken into account in determining the size of the area of these free zones 7, for example by superimposition the associated areas, which is not shown in the Figures. The sensor 1 for the acquisition of the two detection points 4, 5 on the wafer edge is advantageously disposed in the transport chamber in the in-feed region in front of the process chamber. After the wafer has been worked in the process chamber, it is advantageously transported out of it and into the intermediate chamber, to measure it subsequently and to establish from the measurement results the trend analysis and subsequently, according to the results if a certain degree of discrepancy had been determined, to take appropriate corrective measures, such as preferably actively guiding the positioning for greater precisioning of the positioning and/or, for example, other suitable measures on the system during the next transport and/or process steps.

Figure 2B:
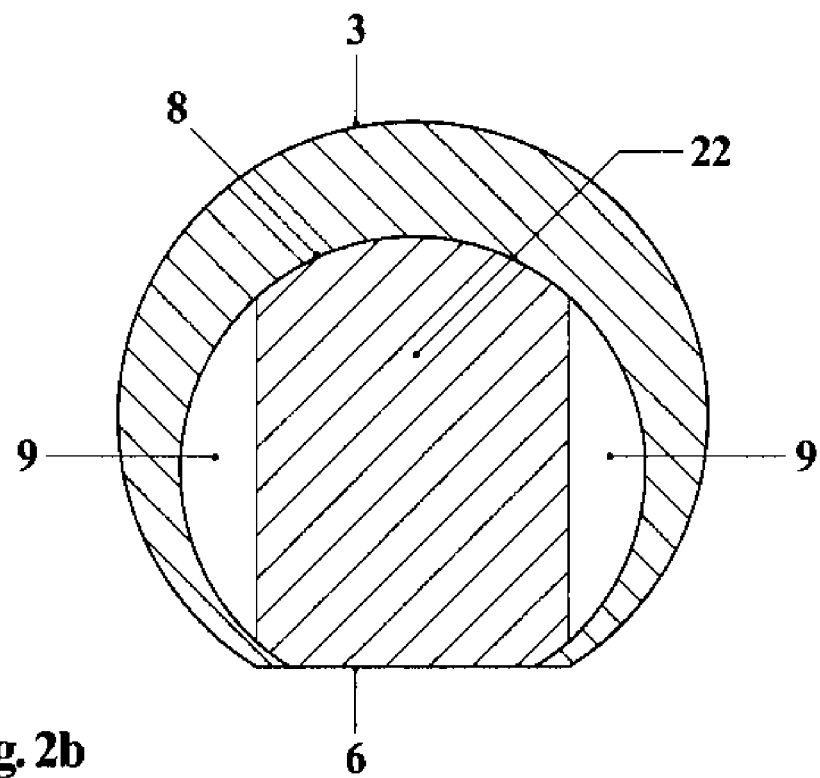

The vacuum process installation with the transport device can also be laid out universally for processing wafers 3 with different diameters. To be able to ascertain the free permitted zones 7 for the invented positioning device, in this case the largest wafer 3 to be worked and the smallest wafer 8 to be worked are considered to be placed in projection one above the other, and aligned at the two reference markers 6, as is shown in FIG. 2b. The resulting free zone for the disposition of the permissible measuring positions then results from the formed free zones 9 of the so-called overlap zone determined by the smallest wafer 8 to be worked. The wafer mounting 10 should here also, as already stated, be disposed beneath the forbidden zone 22.

To attain high measuring accuracy, it is useful to select measuring points far apart, however, this selected distance cannot be greater than the wafer diameter.

Figure 3A:
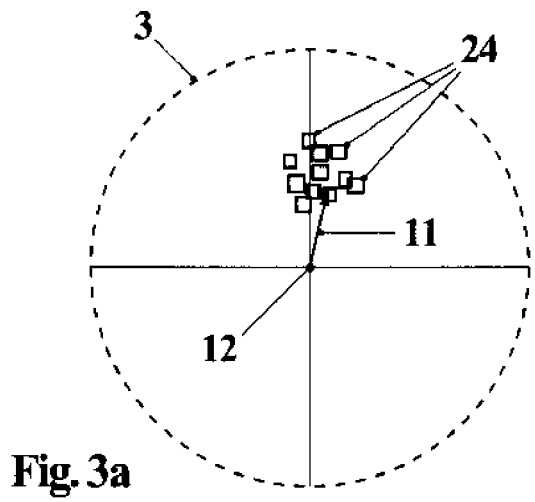
Figure 3B:
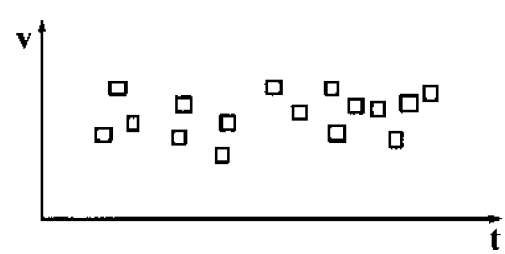

The precise evaluation capability through the present positioning method now permits determining additionally a multiplicity of operating states in the vacuum process installation and, in particular, in the process chamber. With the aid of appropriate analyses of the results, on the one hand, highly specific processes can be assigned and ascertained, and trend analyses of the results can additionally be carried out. The reliable operation of such a process installation can thereby be considerably increased. For example, corrective measures can be taken in time whereby the quality of the production is retained over relatively long production times and, on the other hand, can be detected in time if preventive maintenance work is necessary before rejects are produced or even damage to the process installation occurs. If, for example several wafer positions are evaluated successively and it is ascertained that the nominal position 12 of the wafer 3 is regularly shifted by a similar absolute value magnitude of the displacement vector 11 and the magnitude of the vector is approximately in the same order of magnitude as is shown in FIG. 3*a* in polar depiction, the conclusion can therefrom be drawn that the wafer 3 comes into contact or touches at a certain installation part, for example in the process station, and that for this reason a shift of the wafer position occurs. The displacement length or the displacement path of the displacement vector is in this case of equal magnitude over the number of measurement values or over time, as is schematically shown in FIG. 3*b*.

Figure 4A:
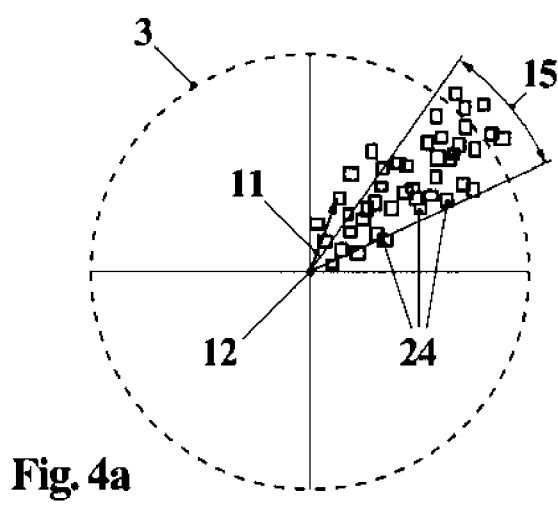
Figure 4B:
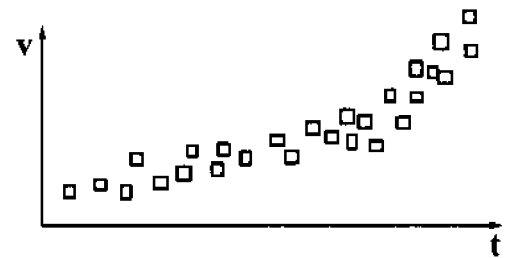

FIG. 4*a* shows a further example, in which in polar depiction are shown several measurement values of a displacement of the nominal position of the wafer center 12, the displacement direction being approximately the same and also within a certain bandwidth of the vector angle 15, the length of the displacement path being different. In FIG. 4*b* is shown that this displacement length increases over the course of time and the number of measurement values 24. This behavior is, for example, typical of the adhesion or partial sticking of the wafer 3 on a shielding, such as is required in coating process stations. The material increasingly growing on shieldings or masking leads to the fact that a wafer, for example, through a type of being soldered on, can adhere thereon and, with stronger growth of the layer, can be displaced further away. The evaluation of the measuring results permit, for example, the detection of the point in time at which installation operation must be interrupted in order to clean or to replace the shielding. The timely detection of this operating state permits, for example, avoiding production reject.

Figure 5A:
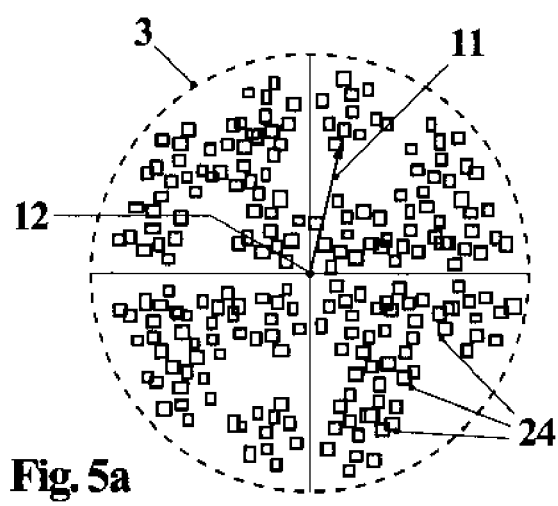
Figure 5B:
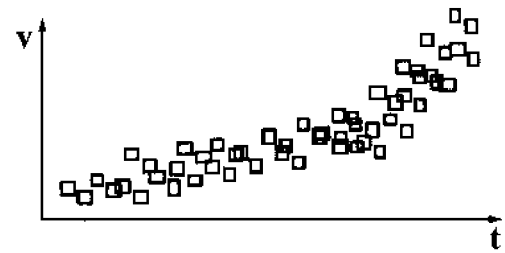

In the polar depiction of FIG. 5*a* measuring values 24 are shown, which are statistically distributed in all directions with different displacement lengths 11 of wafer 3. The displacement lengths 11, depicted over time in FIG. 5*b*, indicate that the displacement length increases in time. This is a typical problem which occurs in so-called electrostatic wafer mountings. The problem intensifies over the course of the operating time and the performance of the holding effect decreases. From this example appropriate measures can also be derived in time when a predetermined level has been exceeded. As the described examples show, through the simple measuring of the displacement vector 11, thus by measuring the vector direction as well as also its length, it is possible to determine the cause with several measurements over time the cause which triggered the error procedures, and, consequently, specifically and precisely the correspondingly necessary corrective measures can be deduced and taken.

The invention claimed is:

1. Method for positioning a wafer (3) with a reference marker (6) in a vacuum process installation with a transport chamber comprising a transport device (2, 20, 21) for moving the wafer (3) in a plane to a process chamber disposed at the transport chamber and with a single sensor (1), which is disposed in front of the process chamber within the transport chamber for acquiring the position of the wafer (3) through the acquisition on its edge at a first detection point (4) and a second detection point (5), such that with electronic evaluation of the two measured detection points (4, 5) the true position of the wafer (12), with the diameter of the wafer known, is determined and the transport device (2, 20, 21) actively guides the wafer (3) to a desired nominal position, characterized in that the wafer (3) with respect to its reference marker (6) is deposited on the transport device (2, 20, 21) with respect to its reference marker (6) aligned in predetermined position and the projection of the reference marker (6) along a motion direction determines on the wafer (3) a disallowable zone (22) and thereby the remaining circular region of the wafer (3) defines a free zone, the sensor (1) being disposed in the transport chamber such that the disallowable zone (22) is reliably not swept over and the sensor (1) thereby can only acquire the circular region of the wafer edge and no portion of the reference marker (6).

2. Method as claimed in claim 1, characterized in that the positioning is a centering process of the wafer (3) for the active guiding of the wafer center (12) onto the predetermined desired nominal position.

3. Method as claimed in claim 1, characterized in that first a measurement is carried out on a first wafer (3) and with further succeeding transport steps with further wafers, correction to a nominal position takes place.

4. Method as claimed in claim 1, characterized in that translatory dislocation errors are corrected.

5. Method as claimed in claim 1, characterized in that the transport device carries out a rotational motion and about a center of rotation (20) and a radial motion away and toward this center for the transport and/or positioning of a wafer (3) into a process chamber and/or a lock chamber.

6. Method as claimed in claim 5, characterized in that the vacuum process installation is a cluster configuration.

7. Method as claimed in claim 1, characterized in that only two detection points (4, 5) on the wafer edge are acquired for each wafer (3) to be measured.

8. Method as claimed in claim 1, characterized in that the wafer (3) through a rotational movement and/or linear movement in the transport plane is guided with its edge to the sensor (1) for the acquisition of the detection points (4, 5).

9. Method as claimed in claim 1, characterized in that the position of the detection points (4, 5) are chosen to be far apart, however less far than the wafer diameter to be measured.

10. Method as claimed in claim 1, characterized in that the wafer mounting is implemented such that it does not disturb the measuring procedure and is positioned beneath the disallowable zone (22).

11. Method as claimed in claim 1, characterized in that each wafer (3) is deposited with the reference marker (6) aligned identically onto the mounting of the transport device (2, 20, 21), put in place with the alignment in the direction of the radial lateral motion (21) toward the center of rotation (20).

12. Method as claimed in claim 1, characterized in that the tolerance bands of the positioning accuracy of the transport device (2, 20, 21) are simultaneously calculated for the determination of the disallowable zone (22).

13. Method as claimed in claim 1, characterized in that a multiplicity of wafer sizes are taken into consideration and such wafer sizes, starting from the same position of their reference markers (6), form an overlap zone (9) which represents the free zone (7).

14. Method as claimed in claim 1, characterized in that the measured discrepancies from the nominal position of the wafers (3), are acquired and stored for the acquisition of the system state for the deduction of corrective measures.

15. Method as claimed in claim 1, characterized in that the wafer (3) is first worked in the process chamber and subsequently is transported from the process chamber into the transport chamber and here is measured with the single sensor (1) and the measured values are processed with electronic means and, upon reaching and/or exceeding a predetermined value, corrective measures are taken in one of the subsequent process steps.

16. Method as claimed in claim 15, characterized in that several measuring steps are processed and a trend analysis regarding the type of error is determined and subsequently measures are determined for the further operating manner of the vacuum process installation, for actuating the transport device (2, 20, 21).

17. Method as claimed in claim 16, characterized in that the contacting of the wafer (3), due to error setting of the transport device with the wafer (3), is acquired by the trend analysis.

18. Method as claimed in claim 16, characterized in that the trend analysis acquires the local displacement of the wafer (3) on the mounting (10) of the transport device based on layer growths on masking parts during the process.

19. Method as claimed in claim 16, characterized in that the trend analysis acquires the loss of efficiency of an electrostatic wafer mounting over the operating time.

\* \* \* \* \*